(12) United States Patent
Chien et al.

(10) Patent No.: US 8,493,722 B2
(45) Date of Patent: Jul. 23, 2013

(54) VIBRATILE DISPLAY DEVICE

(75) Inventors: Yuan-Yu Chien, Hsin-Chu (TW); Kuan-Fu Huang, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 173 days.

(21) Appl. No.: 13/070,615

(22) Filed: Mar. 24, 2011

(65) Prior Publication Data

US 2012/0063070 A1 Mar. 15, 2012

(30) Foreign Application Priority Data

Sep. 10, 2010 (TW) .............................. 99130694 A

(51) Int. Cl.
G06F 1/16 (2006.01)

(52) U.S. Cl.
USPC ........ 361/679.21; 361/804; 361/758; 349/58; 248/571

(58) Field of Classification Search
None
See application file for complete search history.

(56) References Cited

U.S. PATENT DOCUMENTS

| | | | | |
|---|---|---|---|---|
| 4,706,788 A * | 11/1987 | Inman et al. | ................... | 188/378 |
| 4,713,714 A * | 12/1987 | Gatti et al. | ..................... | 360/137 |
| 4,805,946 A * | 2/1989 | Erwin et al. | ................... | 292/251 |
| 5,261,202 A * | 11/1993 | Brunet et al. | .................... | 52/202 |
| 5,281,149 A * | 1/1994 | Petri | ............................... | 439/66 |
| 5,831,816 A * | 11/1998 | Johns et al. | ............. | 361/679.21 |
| 5,963,432 A * | 10/1999 | Crowley | ....................... | 361/804 |
| 6,525,790 B1 * | 2/2003 | Kan-o | .............................. | 349/58 |
| 6,726,505 B2 * | 4/2004 | Cermak et al. | ................. | 439/567 |
| 6,934,162 B2 * | 8/2005 | Perez et al. | .................... | 361/759 |
| 7,085,141 B2 * | 8/2006 | Yi | ................................. | 361/804 |
| 7,264,501 B1 * | 9/2007 | Lin | ................................ | 439/571 |
| 7,441,736 B2 * | 10/2008 | Wiltfang | .................. | 248/220.42 |
| 7,907,399 B2 * | 3/2011 | Kim et al. | ................ | 361/679.55 |
| 8,098,487 B2 * | 1/2012 | Choi | ........................ | 361/679.21 |
| 8,213,174 B1 * | 7/2012 | Kapahi et al. | ............ | 361/679.36 |
| 8,220,878 B2 * | 7/2012 | Yoshinaga et al. | ......... | 303/119.3 |
| 2002/0021382 A1 * | 2/2002 | Hasegawa | ........................ | 349/58 |
| 2003/0059077 A1 * | 3/2003 | Kambe | .......................... | 381/333 |
| 2006/0164567 A1 * | 7/2006 | Fukayama et al. | .............. | 349/58 |
| 2006/0202100 A1 * | 9/2006 | Cheng | ........................... | 248/544 |
| 2008/0030643 A1 * | 2/2008 | Choi | ............................... | 349/58 |
| 2008/0043430 A1 * | 2/2008 | Chen | .............................. | 361/687 |
| 2008/0225197 A1 * | 9/2008 | Maruyama et al. | ............. | 349/58 |

(Continued)

FOREIGN PATENT DOCUMENTS

| | | |
|---|---|---|
| CN | 101464572 | 6/2009 |
| CN | 101566745 | 10/2009 |
| TW | M286938 | 2/2006 |
| TW | M347583 | 12/2008 |

*Primary Examiner* — Adrian S Wilson
*Assistant Examiner* — Abhishek Rathod
(74) *Attorney, Agent, or Firm* — WPAT, PC; Justin King

(57) ABSTRACT

A vibratile display device includes a back plate, a panel assembly and at least one flexible pin. The back plate has a plurality of first fixing holes. The panel assembly is fixed to the back plate and includes a base and a display panel. The base has a carrier portion and a plurality of lugs extending outward from the carrier portion. Each lug has at least one second fixing hole corresponding to the first fixing holes. The display panel is disposed on the carrier portion of the base. An insert portion of the flexible pin is inserted into the first fixing hole of the back plate, and a neck portion of the flexible pin is inserted into the corresponding second fixing hole. A lean portion of the flexible pin is located between the base and the back plate. A top portion of the flexible pin protrudes a surface of the lugs.

11 Claims, 8 Drawing Sheets

U.S. PATENT DOCUMENTS

| | | | |
|---|---|---|---|
| 2009/0067141 A1* | 3/2009 | Dabov et al. | 361/753 |
| 2009/0316354 A1* | 12/2009 | Jang | 361/679.55 |
| 2010/0085693 A1* | 4/2010 | Koshiishi | 361/679.02 |
| 2011/0026211 A1* | 2/2011 | Liao et al. | 361/679.21 |
| 2011/0058318 A1* | 3/2011 | Tsuchida | 361/679.01 |
| 2011/0101187 A1* | 5/2011 | Shaha | 248/231.91 |
| 2012/0063074 A1* | 3/2012 | Matsuda et al. | 361/679.01 |
| 2012/0155000 A1* | 6/2012 | Iwamoto et al. | 361/679.01 |

* cited by examiner

VIBRATILE DISPLAY DEVICE

FIELD OF THE INVENTION

The present invention relates to a vibratile display device, and more particularly to a vibratile display device which can prevent vibration energy transferred to a display panel from dissipating to a back plate of the vibratile display device.

BACKGROUND OF THE INVENTION

As the technology changes day by day, electronic products, which have single function, can not meet the needs of modern people. As far as display devices are concerned, besides displaying frames for users, some display devices can vibrate according to scenarios of the frames or according to commands entered by users so as to increase pleasure for the users when the users watch the frames.

FIG. 1A is a schematic view of a conventional display device, and FIG. 1B is a cross-sectional, schematic view of the display device of FIG. 1A, taken along the line I-I'. Referring to FIG. 1A and FIG. 1B, a display device 100 includes a back plate 110, a panel assembly 120 and a motor 130, wherein the panel assembly 120 includes a base 122 and a display panel 124. The base 122 is fixed to the back plate 110 via screws 140. The display panel 124 is disposed on the base 122.

The motor 130 is disposed on the base 122, and vibration energy provided by the motor 130 is transferred to the display panel 124 via the base 122. In order to prevent the vibration energy transferred from the motor 130 to the display panel 124 from dissipating to other places, a plurality of cushion pads 150 are disposed between the base 122 and the back plate 110 and are disposed between the screws 140 and the base 122.

However, since the screws 140 are made of rigid material and can not absorb the vibration energy, the vibration energy transferred to the display panel 124 is still dissipated to the back plate 110 from the screws 140, thereby vibration effect of the display panel 124 is bad.

SUMMARY OF THE INVENTION

The present invention provides a vibratile display device to improve vibration effect of a display panel capable of vibrating.

To achieve at least one of the above-mentioned advantages, the present invention provides vibratile display device including a back plate, a panel assembly and at least one flexible pin. The back plate has a plurality of first fixing holes. The panel assembly is fixed to the back plate and includes a base and a display panel. The base has a carrier portion and a plurality of lugs extending outward from the carrier portion. Each lug has at least one second fixing hole corresponding to one of the first fixing holes. The display panel is disposed on the carrier portion of the base. The flexible pin has an insert portion, a lean portion, a neck portion and a top portion. The lean portion is located between the insert portion and the neck portion, and the neck portion is located between the lean portion and the top portion. The insert portion is inserted into one of the first fixing holes. Moreover, a diameter of the lean portion is larger than a diameter of the first fixing hole. The neck portion is inserted into the corresponding second fixing hole, and the top portion protrudes a surface of the lugs.

In one embodiment of the present invention, the vibratile display device further includes at least one cover and a front frame. The cover is pressed on the top portion of the flexible pin and is fixed to the back plate. The front frame is fixed to the back plate. The front frame covers the lugs and surrounds the display panel. Moreover, a surface of the cover contacting the top portion has a groove, and the top portion is partially disposed in the groove.

In one embodiment of the present invention, the vibratile display device further includes a front frame pressed on the top portion of the flexible pin and fixed to the back plate. The front frame surrounds the display panel. Moreover, a surface of the cover contacting the top portion has a groove, and the top portion is partially disposed in the groove.

In one embodiment of the present invention, the top portion of the flexible pin can be spherical or tapered.

In one embodiment of the present invention, the carrier portion of the base has an accommodation groove, and the display panel is received in the accommodation groove.

In one embodiment of the present invention, the panel assembly further includes a touch panel disposed on the display panel.

In one embodiment of the present invention, the vibratile display device further includes a vibration energy supply element disposed on the base. For example, the vibration energy supply element is a motor.

In one embodiment of the present invention, the base further includes an extending portion extending outward from the carrier portion. The extending portion has a top surface, a side wall and a bottom surface. The bottom surface is closer to the back plate relative to the top surface. The top surface is connected to the carrier portion and is opposite to the bottom surface. The side wall is interconnected between the top surface and the bottom surface. The vibration energy supply element is, for example, disposed on the bottom surface.

In one embodiment of the present invention, material of the flexible pin is, for example, rubber.

In the present invention, the panel assembly is fixed to the back plate via the flexible pin. Since the panel assembly and the back plate are spaced by the lean portion of the flexible pin, vibration energy transferred to the display panel can be prevented from dissipating to the back plate. Thereby, vibration effect of the display panel can be improved when the display panel receives the vibration energy.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
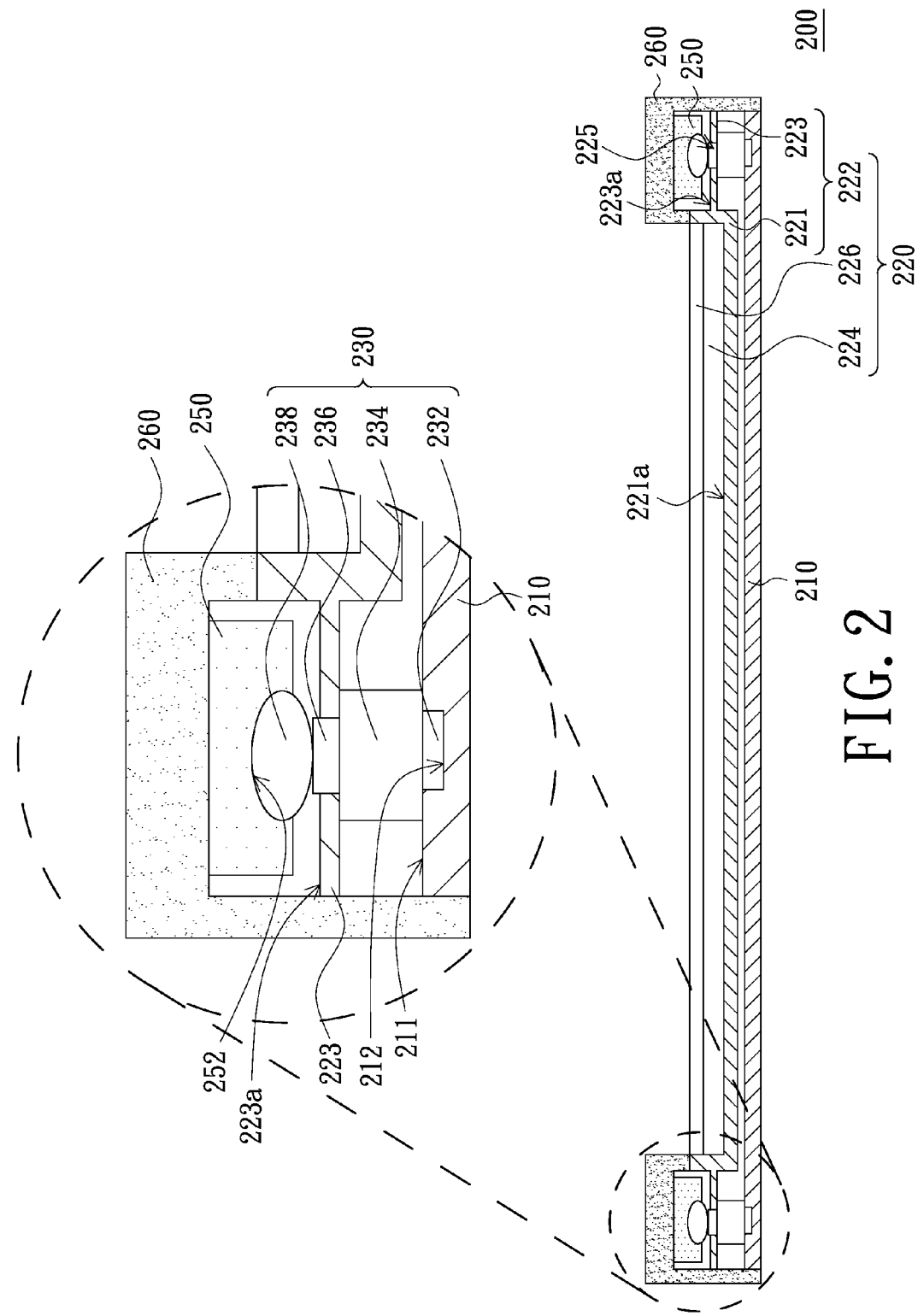
FIG. 2 is a partial cross-sectional, schematic view of a vibratile display device according to an embodiment of the present invention.

FIG. 2 is a partial cross-sectional, schematic view of a vibratile display device according to an embodiment of the present invention. Referring to FIG. 2, a vibratile display device 200 includes a back plate 210, a panel assembly 220 and at least one flexible pin 230. The back plate 210 has a plurality of first fixing holes 212. The panel assembly 220 is fixed to the back plate 210 and includes a base 222 and a display panel 224. More specifically, material of the base 222 is, for example, mental. The base 222 has a carrier portion 221 and a plurality of lugs 223. Furthermore, the carrier portion 221 of the base 222 of the present embodiment, for example, has an accommodation groove 221a, and the display panel 224 is received in the accommodation groove 221a. In the present embodiment, on the one hand, the back plate 210 further includes a touch panel 226 disposed on the display panel 224. On the other hand, a space (not shown) can be formed between the back plate 210 and the panel assembly 220. The space is configured to receive relevant circuits or component connected to the display panel 224.

Figure 1A:
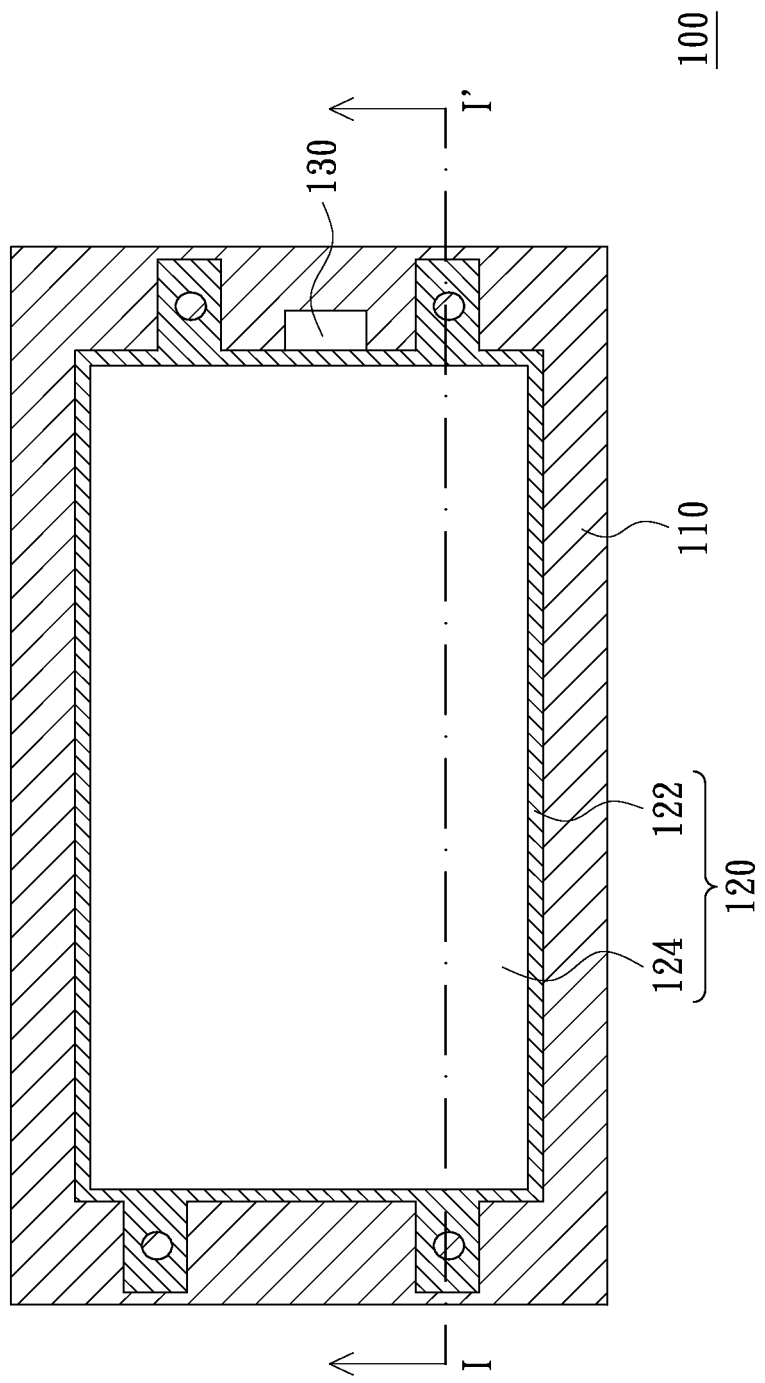
FIG. 1A is a schematic view of a conventional vibratile display device.
Figure 1B:
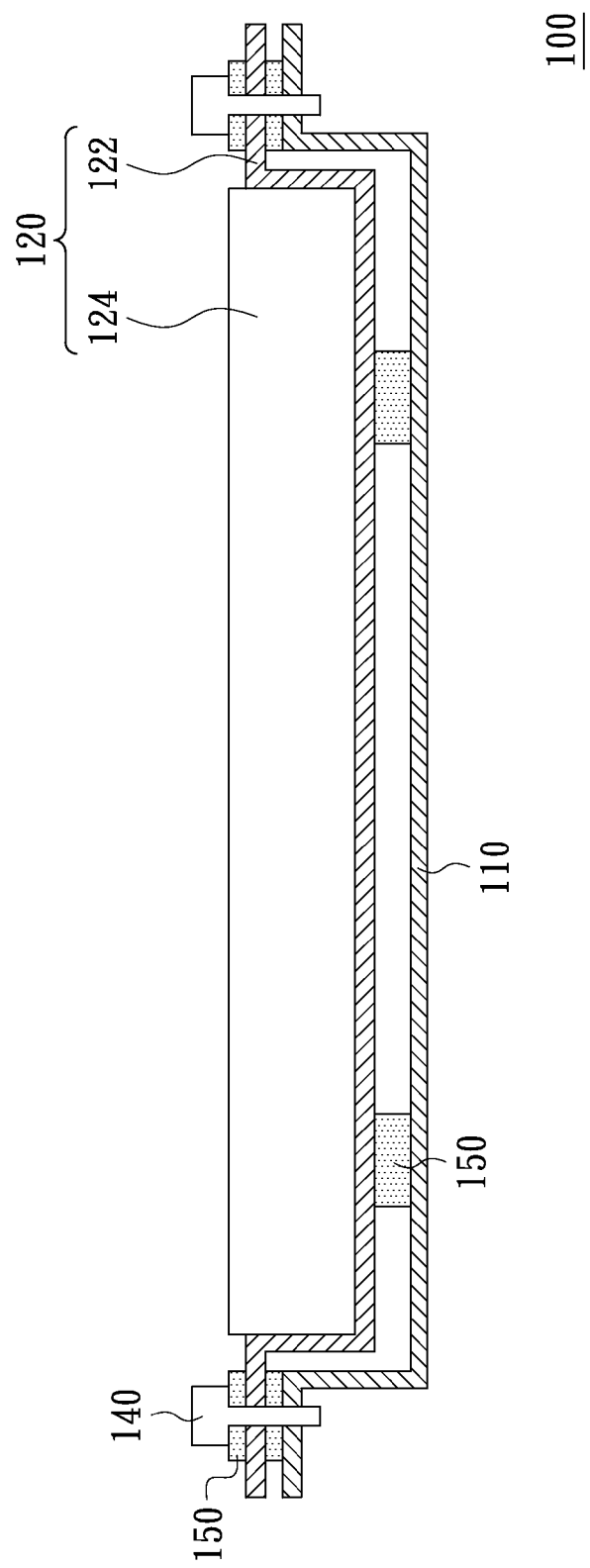
FIG. 1B is a cross-sectional, schematic view of the vibratile display device of FIG. 1A, taken along the line I-I'.

The lugs 223 of the base 222 are extended outward from the accommodation groove 221a of the carrier portion 221. In the present embodiment, the base 222 is similar to the base 110 of FIG. 1, two opposite sides of the base 222 respectively have two lugs 223, but the present invention is not limited to the present embodiment. Each lug 223 has at least one second fixing hole 225 corresponding to one of the first fixing holes 212. The flexible pin 230 is inserted into the first fixing hole 212 and the second fixing hole 225, so as to fix the base 222 to the back plate 210.

Figure 3:
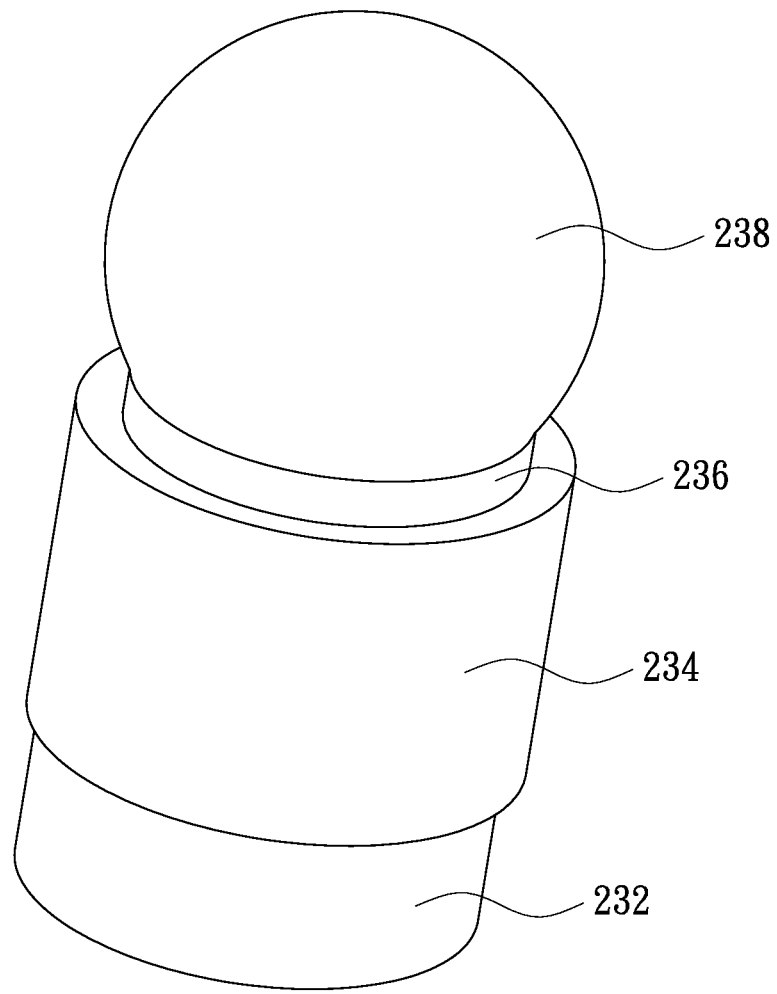
FIG. 3 is a three-dimensional, schematic view of a flexible pin according to an embodiment of the present invention.

FIG. 3 is a three-dimensional, schematic view of a flexible pin according to an embodiment of the present invention. Referring to FIG. 2 and FIG. 3, the flexible pin 230 is made of rubber or other flexible material. The flexible pin 230 includes an insert portion 232, a lean portion 234, a neck portion 236 and a top portion 238. The lean portion 234 is located between the insert portion 232 and the neck portion 236, and the neck portion 236 is located between the lean portion 234 and the top portion 238. Moreover, the insert portion 232 is inserted into the first fixing hole 212 of the back plate 210. A diameter of the lean portion 234 is larger than a diameter of the first fixing hole 212. That is, the lean portion 234 abuts a surface 211 of the back plate 210. The neck portion 236 is inserted into the corresponding second fixing hole 225. The top portion 238 protrudes a surface 223a of the lugs 223. The lugs 223 of the base 222 are fixed between the carrier portion 234 and the top 238. Therefore, the lean portion 234 of the flexible pin 230 is located between the lugs 223 of the base 222 and the back plate 210.

Specifically, the vibratile display device 200 of the present embodiment further includes a cover 250 and a front frame 260. The front frame 260 is fixed to the back plate 210. The front frame 260 covers the lugs 223 of the base 222 and surrounds the display panel 224. For example, the front frame 260 is, for example, assembled to the back plate 210 via hook fastening method. The cover 250 is pressed on the top portion 238 of the flexible pin 230 and is fixed to the back plate 210. As far as the present embodiment concerned, the cover 250 is, for example, fixed to the back plate 210 via screw fixing method. The top portion 238 of the flexible pin 230 is pressed by the cover 250 and slightly deforms, thereby a lateral diameter of the top portion 238 turns larger. Therefore, the base 222 is effectively gripped between the top portion 238 and the lean portion 234 so that the base 222 is avoided to detach from the flexible pin 230 from the top portion 238. It should be noted that, the above-mentioned "lateral" means a direction perpendicular to an extending direction of the flexible pin 230.

The cover 250, for example, has a groove 252 which is located on a surface of the cover 250 contacting the top portion 238 of the flexible pin 230. Shape and thickness of the groove 252 correspond to a partial outline of the tip portion 238 of the flexible pin 230. When the cover 250 is pressed on the top portion 238 of the flexible pin 230, the top portion 238 is partially received in the groove 252.

Figure 4:
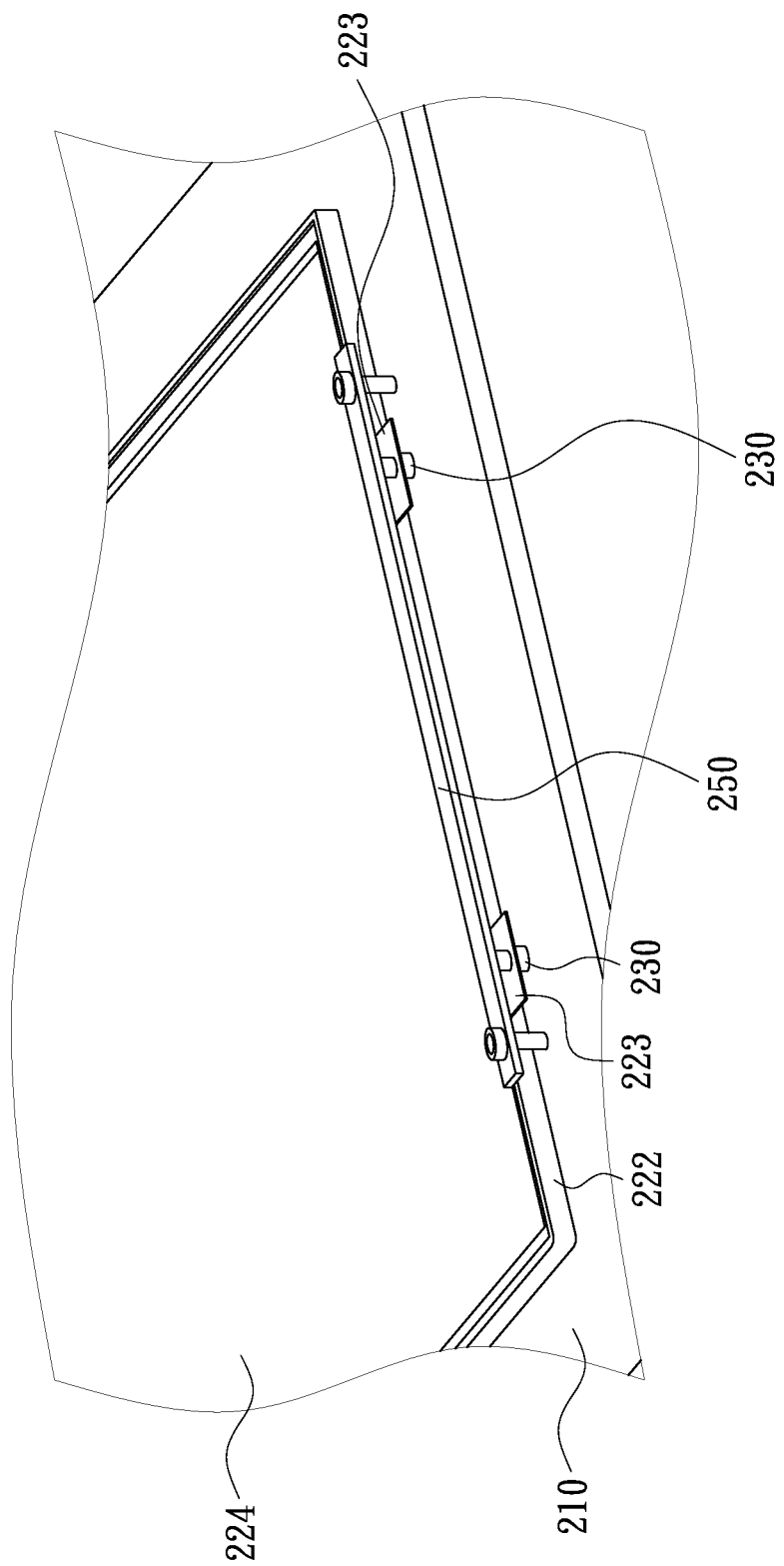
FIG. 4 is a partial three-dimensional, schematic view of a vibratile display device according to an embodiment of the present invention.

The cover 250 of the present embodiment is a long strip, and is pressed on the flexible pins 230 disposed on a same side of the base 222, as shown in FIG. 4, but the present invention is not limited to the present embodiment. In other embodiments, a number of the cover 250 can be equal to a number of the flexible pins 230. That is, each cover 250 is pressed on the top of the corresponding single flexible pin 230.

Figure 5A:
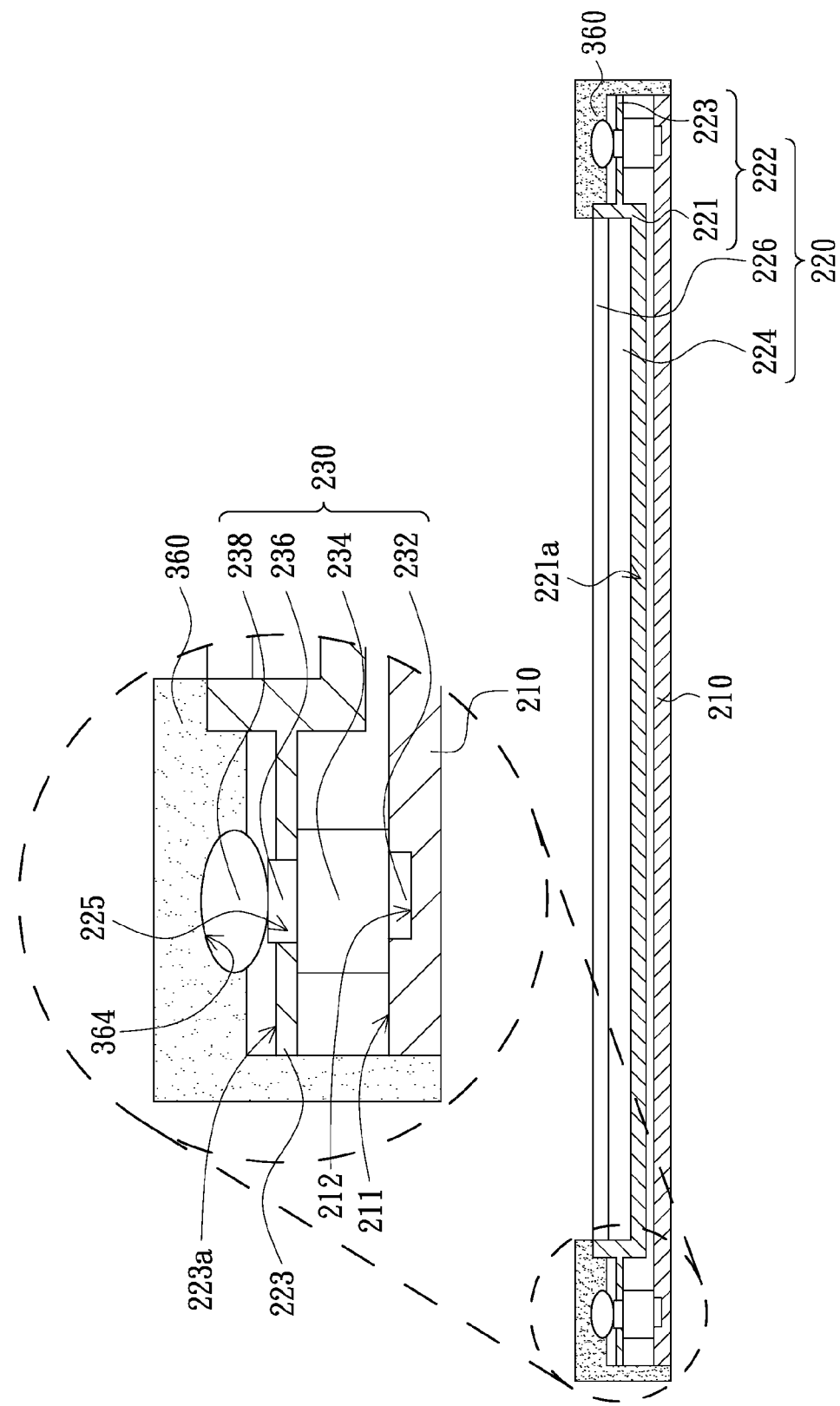
FIG. 5A is a partial cross-sectional, schematic view of a vibratile display device according to another embodiment of the present invention.
Figure 5B:
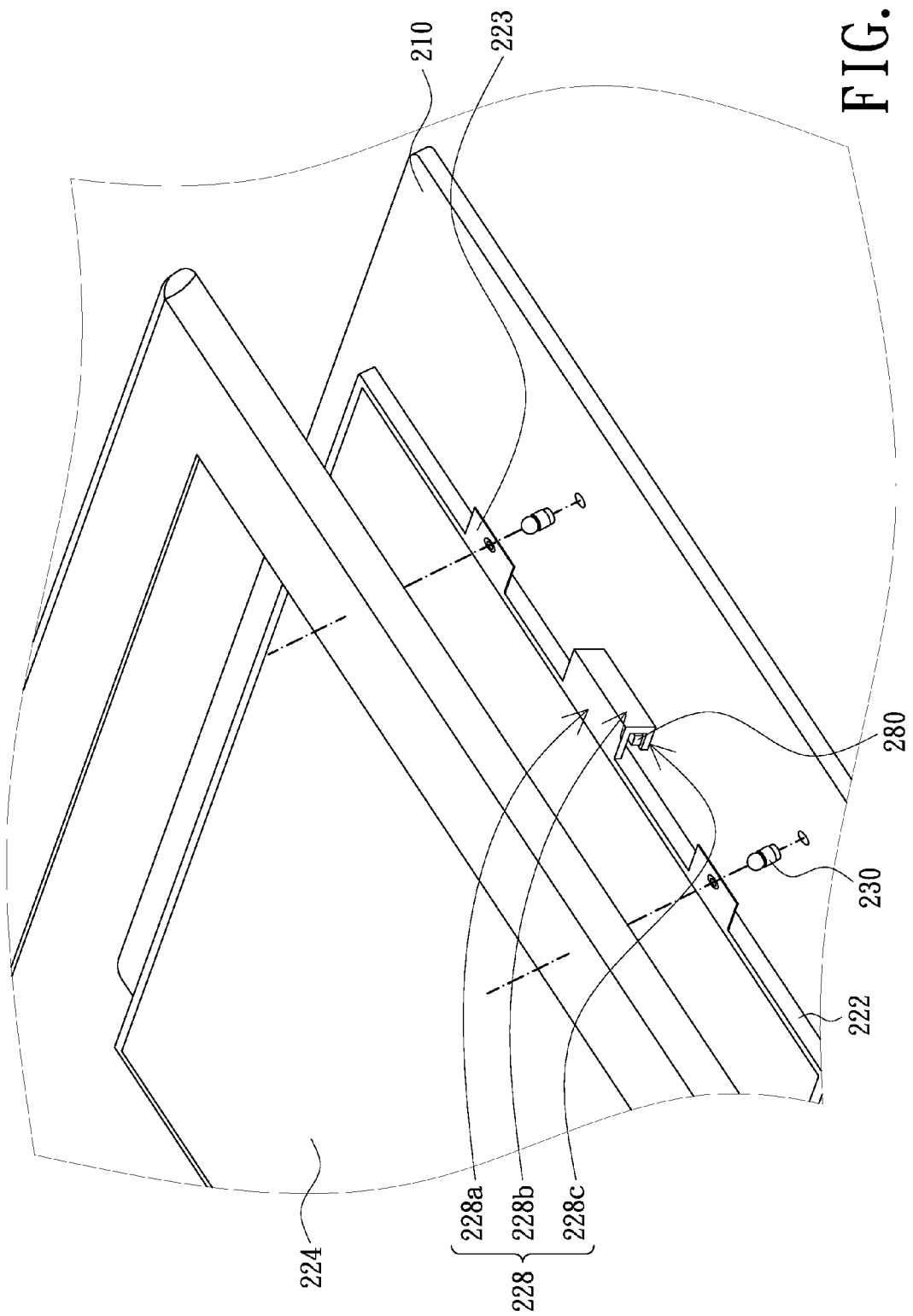
FIG. 5B is a partial three-dimensional, schematic view of the vibratile display device of FIG. 5A.

Additionally, in another embodiment of the present invention, the front frame 360 is directly pressed on the top portions 238 of the flexible pins 230, as shown in FIG. 5A and FIG. 5B, so as to reduce cost. Moreover, a surface of the front frame 360 contacting the top portion 238 can have a groove 364 corresponding to outline of the top portion 238.

Figure 6:
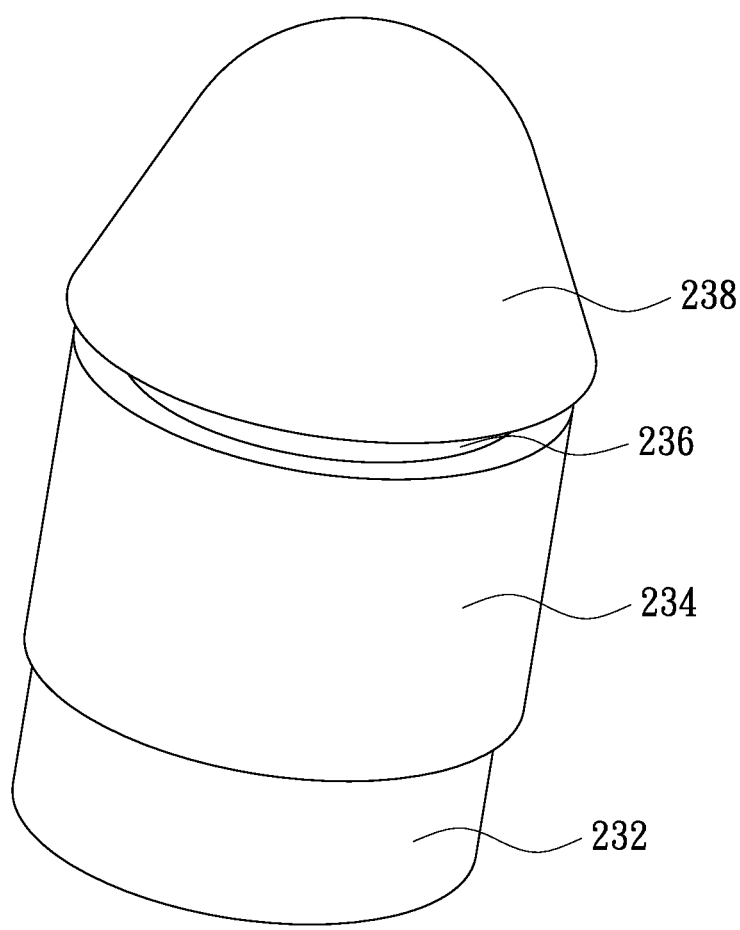
FIG. 6 is a three-dimensional, schematic view of a flexible pin according to another embodiment of the present invention.

It is worth noting that, the top portion 238 of the flexible pin 230 as shown in figures of the above-mentioned embodiment is spherical, which is convenient for reworking, but the present invention is not limited to the present embodiment. In other embodiments, the top portion 238 can be tapered, as shown in FIG. 6, a diameter of the top portion 238 becomes larger along a direction towards the neck portion 236 so that it is convenient for gripping the base 222 between the top portion 238 and the lean portion 234, thereby assembly reliability between the base 222 and the flexible pin 230 can be promoted.

Referring to FIG. 5B further, in order to increase using pleasure for users, the vibratile display device 200 of the present embodiment further includes a vibration energy supply element 280 disposed on the base 222. When a user starts the vibration energy supply element 280 via entering commands into the touch panel 226, vibration energy provided by the vibration energy supply element 280 can be transferred to the display panel 224 through the base 222, so that the user can feel the vibration of the display panel 224. In the present embodiment, the vibration energy supply element 280 is, for example, a motor.

Specifically, in an embodiment, the base 222 further has an extending portion 228, as shown in FIG. 5B, the extending portion 228 extends outward from the carrier portion 221 and has a top surface 228a, a side wall 228b and a bottom surface 228c. More specifically, the top surface 228a of the extending portion 228 is connected to the carrier portion 221 and is opposite to the bottom surface 228c. The bottom surface 228c is closer to the back plate 210 relative to the top surface 228a. The side wall 228b is interconnected between the top surface 228a and the bottom surface 228c. The vibration energy supply element 280 is disposed on the bottom surface 228c of the extending portion 228.

The panel assembly 220 and the back plate 210 are spaced by the lean portion 234 of the flexible pin 230, and the flexible pin 230 is made of material with elasticity and flexibility. Therefore, the vibration energy of the display panel 224 can be prevented from dissipating to the back plate 210, thereby the vibratile display device 200 has better vibration effect.

In summary, the vibratile display device of the present invention adopts the flexible pin which is used to fix the panel assembly to the back plate. Since the panel assembly and the back plate are spaced by the lean portion of the flexible pin, the vibration energy can stay on the display panel via the elastic flexible pin. The vibration energy can be prevented from dissipating to the back plate, thereby vibration effect of the display panel can be improved when the display panel receives the vibration energy.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A vibratile display device comprising: a back plate having a plurality of first fixing holes; a panel assembly fixed to the back plate, the panel assembly comprising:
   a base having a carrier portion and a plurality of lugs extending outward from the carrier portion, each lug having at least one second fixing hole corresponding to one of the first fixing holes, the base being physically isolated from the back plate;
   a display panel disposed on the carrier portion of the base;
   at least one flexible pin having an insert portion, a lean portion, a neck portion and a top portion, wherein the lean portion is located between the insert portion and the neck portion, the neck portion is located between the lean portion and the top portion, the insert portion is inserted into one of the first fixing holes, a diameter of the lean portion is larger than a diameter of the first fixing hole, the neck portion is inserted into the corresponding second fixing hole, and the top portion protrudes a surface of the lugs, and the back plate and one of the lugs of the base are separated only by the lean portion of the flexible pin; and
   at least one cover pressed on the top portion of the flexible pin and fixed to the back plate such that the top portion is pressed to deform by the cover and a lateral diameter of the top portion is expanded for gripping one of the lugs of the base between the top portion and the lean portion; and
   a front frame fixed to the back plate, and the front frame covering the lugs and surrounding the display panel.

2. The vibratile display device according to claim 1, wherein a surface of the cover contacting the top portion has a groove, and the top portion is partially disposed in the groove.

3. The vibratile display device according to claim 1, further comprising a front frame pressed on the top portion of the flexible pin and fixed to the back plate, and the front frame surrounding the display panel.

4. The vibratile display device according to claim 3, wherein a surface of the front frame contacting the top portion has a groove, and the top portion is partially disposed in the groove.

5. The vibratile display device according to claim 4, wherein the top portion of the flexible pin is spherical or tapered.

6. The vibratile display device according to claim 1, wherein the carrier portion of the base has an accommodation groove, and the display panel is received in the accommodation groove.

7. The vibratile display device according to claim 1, wherein the panel assembly further comprises a touch panel disposed on the display panel.

8. The vibratile display device according to claim 1, further comprising a vibration energy supply element disposed on the base.

9. The vibratile display device according to claim 8, wherein the base further comprises an extending portion extending outward from the carrier portion, the extending portion has a top surface, a side wall and a bottom surface, the bottom surface is closer to the back plate relative to the top surface, the top surface is connected to the carrier portion and is opposite to the bottom surface, the side wall is interconnected between the top surface and the bottom surface, and the vibration energy supply element is disposed on the bottom surface.

10. The vibratile display device according to claim 8, wherein the vibration energy supply element is a motor.

11. The vibratile display device according to claim 1, wherein material of the flexible pin comprises rubber.

* * * * *